United States Patent [19]

Minkoff et al.

[11] Patent Number: 4,707,663

[45] Date of Patent: Nov. 17, 1987

[54] NUCLEAR MAGNETIC RESONANCE APPARATUS USING LOW ENERGY MAGNETIC ELEMENTS

[75] Inventors: Lawrence A. Minkoff, Merrick; Gordon T. Danby, Melleville, both of N.Y.

[73] Assignee: Fonar Corporation, Melville, N.Y.

[21] Appl. No.: 766,115

[22] Filed: Aug. 15, 1985

[51] Int. Cl.⁴ .................... G01R 33/20; H01F 7/00
[52] U.S. Cl. ............................. 324/319; 335/304; 335/306; 324/318
[58] Field of Search ............ 324/300, 307, 309, 318, 324/319, 320; 335/297, 302, 304, 306, 298

[56] References Cited

U.S. PATENT DOCUMENTS

| | | | |
|---|---|---|---|
| 3,030,556 | 4/1962 | Watson | 335/298 |
| 3,253,194 | 5/1966 | Parker | 335/298 |
| 3,437,963 | 4/1969 | Gang et al. | 335/298 |
| 3,889,220 | 6/1975 | Spodig | 335/306 |
| 4,048,555 | 9/1977 | Rupp, Jr. et al. | 324/320 |
| 4,093,912 | 6/1978 | Double et al. | 324/320 |
| 4,580,098 | 4/1986 | Gluckstern et al. | 324/307 |
| 4,644,313 | 2/1987 | Miyajima | 324/318 X |

FOREIGN PATENT DOCUMENTS 0050442  3/1985  Japan .................... 324/307

Primary Examiner—Michael J. Tokar
Assistant Examiner—Scott M. Oldham
Attorney, Agent, or Firm—Lerner, David, Littenberg, Krumholz & Mentlik

[57] ABSTRACT

An NMR scanner apparatus uses a permanent magnet comprised of an assembly of magnetic material formed of a substantial number of low energy permanent magnetic elements producing magnetic flux and arranged in at least one row of columns. A frame of magnetically soft material provides a return path for the magnetic flux and provides a surface from which the columns of magnetic elements extend. A flux concentrator plate is disposed adjacent to a surface of the assembly and recessed a sufficient distance from the edge of the assembly to inhibit the loss of magnetic flux. The flux concentrator plate and the frame sandwich the magnetic assembly therebetween. A pole piece consisting of a soft magnetic material is disposed adjacent to a surface of the flux concentrator plate. The pole piece defines a scanning area substantially smaller than the area of the adjacent surface of the flux concentrator plate such that the pole piece exhibits parallel lines of magnetic flux for inducing polarization in living tissue.

22 Claims, 4 Drawing Figures

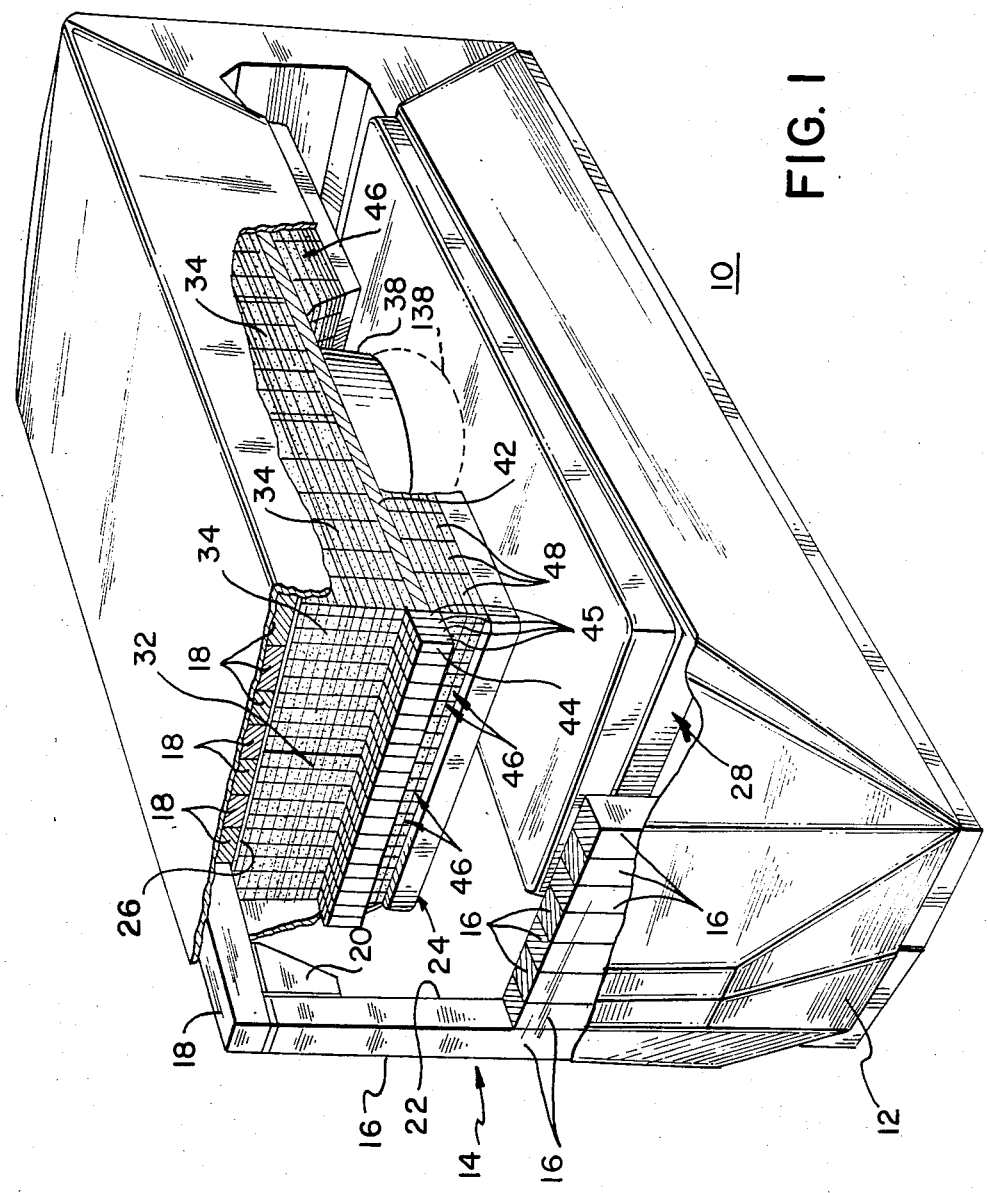

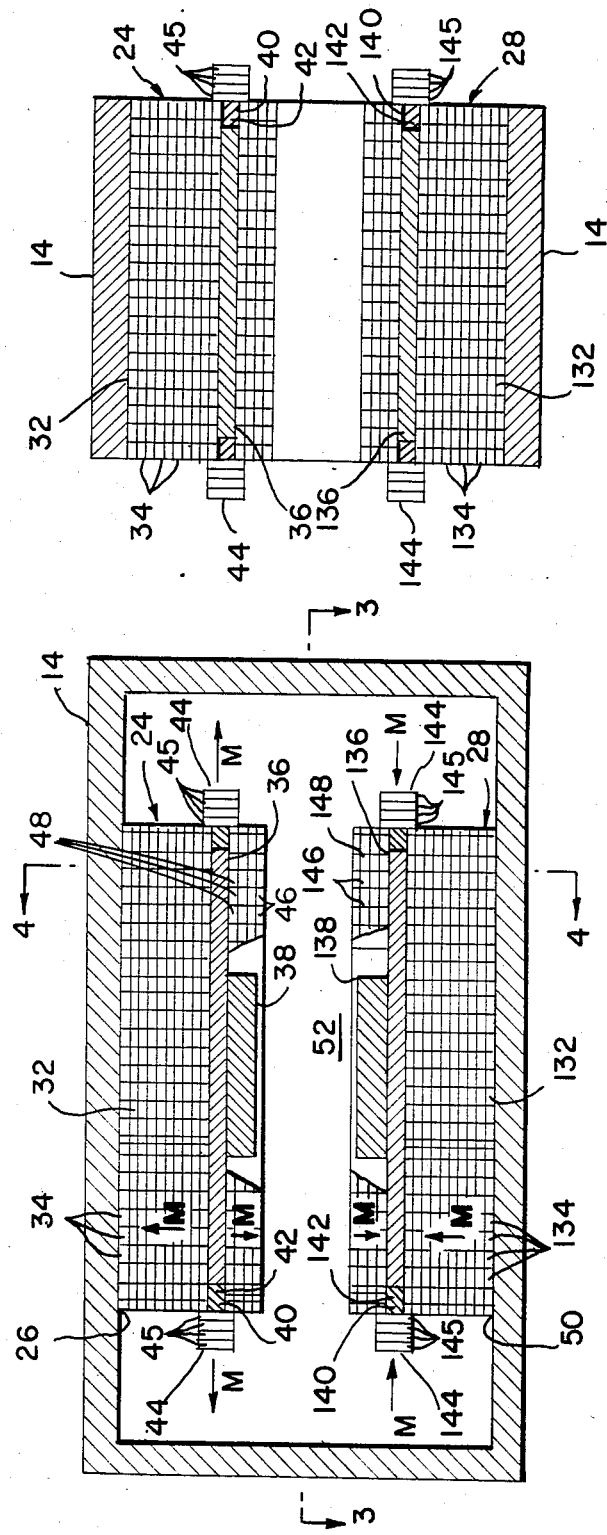

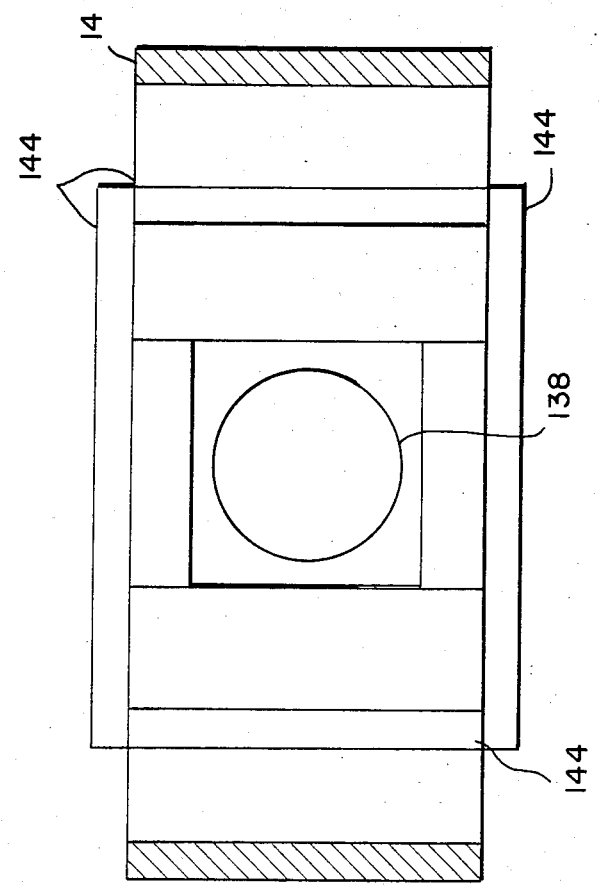

NUCLEAR MAGNETIC RESONANCE APPARATUS USING LOW ENERGY MAGNETIC ELEMENTS

BACKGROUND OF THE INVENTION

Field of the Invention

The present invention relates to nuclear magnetic resonance (NMR) apparatus for scanning and imaging, and more particularly to NMR apparatus which include a primary magnetic field produced by an assembly of low energy permanent magnetic elements.

NMR apparatus are used in a wide variety of analytical and diagnostic applications. The primary components of an NMR apparatus used for imaging biological tissue, and more particularly whole body imaging of biological tissue, include a primary magnetic field, a source of radio-frequency energy, and a detector. The object to be analyzed is positioned within the primary magnetic field and is simultaneously subjected to the radio-frequency energy. The radio-frequency energy is absorbed by the object to be analyzed thereby elevating the energy level of the atomic neuclei of the object. After the irradiation of the atomic neuclei are completed, the object is allowed to return to its initial lower energy state by re-radiating the absorbed energy. That re-radiated energy is measured by the detector. Standard well-known NMR techniques are then used to analyze the detected signals to provide an image.

In order to effectively image a subject such as an entire human body, the magnet providing the primary magnetic field must be constructed of sufficient size to accomodate the human body therein. In addition, the primary magnetic field must be of sufficient strength and substantially uniform over a relatively large area in order to construct images from the re-radiated energy.

In the past, NMR apparatus have employed air core electromagnets to produce the primary magnetic field. In order to obtain stronger magnetic fields, air core super-conducting electromagnets were later used. These super-conducting electromagnets can be operated only at approximately $-269°$ C. The systems necessary to produce and maintain such temperatures are expensive, difficult to manufacture, and difficult to maintain. Cooling of the super-conducting electromagnets is accomplished by submerging coils in a liquid helium container which is thermally isolated from room temperature by a combination of vacuum, super-insulation material, and a liquid nitrogen cooled shield. Those substances boil off and must constantly be replenished. Costs of $100,000.00 a year in liquid helium and nitrogen to keep the electromagnet in operation are not uncommon.

Furthermore, the magnetic lines of flux generated by air core electromagnets cover an immense area and, because interference with these lines of magnetic flux can cause inappropriate NMR responses, elaborate sanctuaries isolating the NMR apparatus from the remainder of the hospital environment must be constructed. While NMR apparatus using super-conducting electromagnets have provided excellent results, the complexity and costs associated with the vacuum and cooling systems as well as the large amount of isolated space required have limited the wide-spread application of such apparatus.

In U.S. Patent Application Ser. No. 650,558 filed Sept. 13, 1984, and assigned to the same assignee as the present invention, now abandoned it was recognized that a permanent magnet formed of a combination of relatively low energy magnetic material and relatively high energy magnetic material could be used to provide a primary magnetic field of sufficient strength per unit volume. Prior to that invention, it had been thought impractical to employ a permanent magnet for producing the primary magnetic field.

SUMMARY OF THE PRESENT INVENTION

The present invention is directed to an NMR scanner apparatus using a permanent magnetic field produced by low energy magnetic elements. An assembly of magnetic material formed of a substantial number of low energy permanent magnetic elements producing magnetic flux are arranged in at least one row of columns. A frame of magnetically soft material provides a return path for the magnetic flux and provides a surface from which the columns of magnetic elements extend. A flux concentrator is disposed adjacent to a surface of the assembly and is recessed a sufficient distance from the edges of the assembly to inhibit the loss of magnetic flux. The flux concentrator and the frame sandwich the assembly of magnetic material therebetween. A pole piece is provided which consists of a soft magnetic material. The pole piece is disposed adjacent to a surface of the flux concentrator and defines a scanning area substantially smaller than the area of the adjacent surface of the flux concentrator such that the pole piece exhibits parallel lines of magnetic flux for inducing polarization in living tissue.

The NMR scanner of the present invention represents a substantial advance over the art in that for the first time a permanent magnetic field can be produced without the use of expensive rare earth magnets by an apparatus which does not exceed acceptable size and weight limitations. Thus, the apparatus of the present invention provides a primary magnetic field of sufficient strength per unit volume but is substantially cheaper to produce because of the elimination of the rare earth magnets.

Another aspect of the present invention is the reduction of leakage flux. This is accomplished, in one manner, by recessing the flux concentrator from the edges of the assembly and by filling in the area between the edges of the recessed flux concentrator and the edges of the assembly with a non-magnetic material. Permanent magnetic elements positioned adjacent to the non-magnetic material also inhibit the loss of magnetic flux.

Another aspect of the present invention includes providing a pole piece of cylindrical configuration. Such a pole piece is more efficient than a square or rectangular pole piece and, because it has no sharp corners, it provides a more uniform magnetic field with less leakage flux. These and other advantages and benefits of the present invention will become apparent from the description of a preferred embodiment hereinbelow.

BRIEF DESCRIPTION OF THE DRAWINGS

In order that the present invention may be clearly understood and readily practiced, a preferred embodiment will now be described, by way of example only, with reference to the accompanying drawings wherein:

FIG. 1 is a partially broken away perspective view of an NMR apparatus constructed according to the teachings of the present invention;

FIG. 2 is a cross sectional view of the apparatus of FIG. 1 with the first and second permanent magnetic structures broken away to illustrate the flux concentrators and pole pieces;

FIG. 3 is a view of the lower half of the apparatus illustrated in FIG. 2 taken along the lines 3—3; and FIG. 4 is an end view of the apparatus illustrated in FIG. 2 taken along the lines 4—4.

DESCRIPTION OF A PREFERRED EMBODIMENT

Referring to FIG. 1, there is illustrated a nuclear magnetic resonance scanning and imaging apparatus 10. The apparatus 10 is comprised of a housing 12 surrounding a supporting structure or frame 14 which is constructed of a plurality of magnetizable steel or iron vertical girders 16 and horizontal girders 18. The steel girders 16 and 18 are assembled with the aid of corner pieces 20 to form a plurality of substantially rectangular structures which are joined together side-by-side to form the frame 14. The frame 14 defines an opening 22 formed by the girders 16 and 18.

Although the girders 16 and 18 are illustrated in a particular configuration, it is to be understood that other assemblies or structures can be employed to fabricate the desired frame 14. For instance, the frame 14 may be constructed of four rectangular plates or other similar configurations to produce a frame 14 having an opening 22 therein for the mounting of the remainder of the components of the NMR apparatus 10.

With reference to FIGS. 1, 2, and 4, the NMR apparatus 10 can be seen to include a first permanent magnet structure 24 and a second permanent magnet structure 28. The first permanent magnet structure 24 and the second permanent magnet structure 28 are substantially identical. Therefore, only the first permanent magnet structure 24 will be described in detail, it being understood that such description is equally applicable to the second permanent magnetic structure 28.

The first permanent magnetic structure 24 includes an assembly 32 of a plurality of relatively low energy flux magnetic elements which may be a plurality of low energy flux magnets such as ceramic magnets 34 or the like. The ceramic magnets 34 are arranged in rows of columns to form a matrix configuration with the columns extending from a first surface 26 of the frame 14. The ceramic magnets 34 are arranged with appropriate polarity orientation so that the magnetic flux is additive.

A plate 36, seen in FIGS. 2 and 4, serves as a means for concentrating and conducting magnetic flux. The flux concentrator plate 36 is disposed adjacent to a surface of the magnetic assembly 32 such that the assembly 32 is sandwiched between the plate 36 and the first surface 26 of the frame 14. The plate 36 is magnetically conductive and may be constructed of magnetic steel, iron, or the like. The plate 36 serves to concentrate the magnetic flux of the first magnetic assembly 32. The concentrated flux is then conducted through the plate 36 into a pole piece 38 shown in FIGS. 1 and 2.

The pole piece 38 consists essentially of a soft magnetic material disposed adjacent to a surface of the flux concentrator plate 36. In one embodiment, the pole piece may have a cylindrical configuration as best seen in FIG. 3 which illustrates the lower or second pole piece 138. The pole piece 38 defines a scanning area which is substantially smaller than the area of the adjacent surface of the flux concentrator plate 36 such that the pole piece 38 exhibits parallel lines of magnetic flux for inducing polarization in living tissue. The use of a round pole piece eliminates any sharp corners thereby providing a more uniform and efficient field.

It is also anticipated that the flux concentrator plate 36 and pole piece 38 may be of an integral or unitary construction.

One feature of the present invention is to provide an NMR apparatus having a pole piece 38 consisting essentially of a soft magnetic material thereby eliminating the use of expensive rare earth magnets. It is contemplated, however, that the description of the pole piece 38 as "consisting essentially of" a soft magnetic material, includes a pole piece having, for example, one layer, or any other small amount, of rare earth magnets.

With the substantial elimination of the rare earth magnets from the pole piece 38, it is necessary for the first permanent magnet 24 to be more efficient than heretofore thought possible if the overall NMR apparatus is to remain within acceptable weight and size limitations. One feature which increases the efficiency of the first permanent magnet 24, namely the use of a round pole piece 38, has already been discussed. A second feature which increases the efficiency of the first permanent magnet 24 involves the recessing of the flux concentrator plate 36 a sufficient distance from the edges of the magnetic assembly 32 to inhibit the loss of magnetic flux. The recessing of the flux concentrator plate 36 is best illustrated in FIGS. 2 and 4. The recessed area extends entirely around the flux concentrator plate 36. This recessed area may be filled in with a non-metallic material 42, such as aluminum.

In addition to recessing the flux concentrator plate 36 and filling the recessed area 40 with a nonmetallic material 42, the apparatus of the present invention also uses columns or stacks 44 of ceramic magnets 45, of an appropriate polarity, positioned adjacent to the non-metallic material 42 to further inhibit the loss of magnetic flux. It is anticipated that the ceramic magnets 45 may be of the same type as that used for the ceramic magnets 34 of the main assembly 32.

With the flux concentrator plate 36 recessed from the edge of the assembly 32, a certain number of ceramic magnets 34 of the main assembly 32 are no longer contributing their flux to the overall useful flux of the system. However, it has been found that recessing the flux concentrator plate 36, filling in the recessed area 40 with a non-metallic material 42, and using the blocking stack 44 of ceramic magnets 45 increases the overall efficiency of the system such that the loss of flux due to recessing the flux concentrator plate 36 is more than compensated for.

In order to further reduce leakage flux from the flux concentrator plate 36, rows of columns 46 of ceramic magnets 48, with their polarity reversed relative to the first assembly 32, are provided adjacent to, but spaced from, the pole piece 38. It is anticipated that a ceramic magnetic material such as ferrite 8 may be used for the ceramic magnets 34 f the main assembly 32, the ceramic magnets 45 of the blocking stack 44, and for the ceramic magnets 48. In choosing a ceramic magnet, it is important to choose a magnet which will not become demagnitized if positioned on an outer extremity of the assembly 32, i.e., at the edge of the flux concentrator plate 36.

It is anticipated that having eliminated the rare earth magnets from the pole piece 38, the amount of magnetic material in the assembly 32 need only be increased by approximately 10% over, for example, the apparatus disclosed in the aforementioned U.S. patent application Ser. No. 650,558, which is hereby incorporated by reference, in order to produce a primary magnetic field sufficient for imaging living tissue. The increase in the assembly 32 need only be 10% because the overall system has been made more efficient by recessing the flux concentrator plate 36, filling in the recessed area 40 with a nonmagnetic material 42, providing blocking stacks 44 of ceramic magnets 45 and blocking stacks 46 of ceramic magnets 48, and using a round rather than a square pole piece 38. Thus, the increase in size and weight of the NMR apparatus is maintained within acceptable limits.

The ceramic magnets 34, 45, and 48 are each formed of bricks approximately four inches by six inches by one inch. In order to mount the magnets into the required rows of columns to form the assembly, suitable nonmagnetic material such as aluminum can be employed. The polarity of the magnets in the assembly 32 and in the stacks 44 and 46 is such that the upper face of each of the bricks is one pole of the magnet and the lower face of each of the bricks is another pole of the magnet. The bricks are stacked in a manner known in the art such that the negative pole of one brick contacts the positive pole of the next brick in each stack. When the bricks are of reversed polarity, each stack is still in the same configuration, but the upper and lower most poles of the stacks are reversed relative to the other stacks. For purposes of illustration, arrows marked with a capital M have been illustrated in FIG. 2 to show the relationships of the poles of the various stacks.

The second permanent magnet structure 28 is virtually identical to the first permanent magnetic structure 24 and includes a first assembly 132 of relatively low energy flux magnetic elements 134, a flux concentrator plate 136, and a pole piece 138. The flux concentrator plate 136 sandwiches the second assembly 132 between itself and a second surface 50 of the frame 14. The flux concentrator plate 136 is recessed from the edge of the second assembly 132 providing a recessed area 140 which extends entirely around the flux concentrator plate 136. The recessed area 140 is filled in with a nonmetallic material 142. Stacks 144 of ceramic magnets 145 as well as stacks 146 of ceramic magnets 148 are provided which perform the same function as discussed hereinabove in conjunction with the first permanent magnet 24.

The frame 14 provides a flux return path for the flux produced by the first and second permanent magnets 24 and 28, respectively. For example, the flux path for the flux produced by the first permanent magnet 24 includes the frame 14, second permanent magnet 28, flux concentrator plate 136, pole piece 138, air gap 52, pole piece 38, and flux concentrator plate 36. Such a closed loop system provides for efficient use of the magnetic flux.

The magnetic flux developed between the pole pieces 38 and 138 in an apparatus constructed according to the teachings of the present invention is approximately 3,000 gauss and is stable to one part in $10^{-4}$ over a radius of eight inches. The hereinbefore discussed combination of improvements permits the production of a magnetic field having the noted strength and flatness in an area the size of which is practical, at an economically feasible cost, while staying within acceptable weight and size limitations. However, if a desired flatness is not acheived, for instance, a flatness better than one part in $10^{-3}$ over a ten inch diameter, through the configuration of the permanent magnets alone, it is to be understood that shim material or electromagnetic shim coils (not shown) can be used to further flatten the field. Such shim coils may be placed over the pole pieces 38 and 138.

In addition to the provision of the primary magnetic field between the pole pieces 38 and 138, an rf field source, a detector for detecting nuclear magnetic resonance, and means for moving the body or other subject to be imaged into the magnetic field in the air gap 52 are also provided. However, since those elements are known in the art and are not a part of the present invention, they have not been illustrated.

When the permanent magnetic construction of the present invention is employed in an NMR apparatus it has been found to be desireable to work at a frequency of 12 megahertz.

It is known that permanent magnets drift as a result of changes in temperature. The drift of a magnet constructed according to the present invention has been held to less than 10 hertz per hour by temperature regulation of the interior of the housing 12. This temperature regulation is accomplished by a heater (not shown) of the forced air type which is disposed within the housing 12. The heater senses the temperature within the housing 12 via a thermister (not shown) disposed in one of the magnetic elements and circulates heated air within the housing to maintain a desired temperature. For example, a temperature of 77° F. has been employed.

While the present invention has been described in connection with an exemplary embodiment thereof, it will be understood that many modifications and variations will be readily apparent to those of ordinary skill in the art. This application and the following claims are intended to cover those modifications and variations.

What is claimed is:

1. An NMR scanner apparatus using a permanent magnetic field produced by low-energy magnetic elements, comprising:
   a principal assembly of magnetic material formed of a substantial number of low-energy permanent magnetic elements producing magnetic flux and arranged in at least one row of columns;
   a frame of magnetically soft material providing a return path for said magnetic flux, said frame having a surface, said columns of magnetic elements extending from said frame surface so that said columns of magnetic elements cooperatively define a principal magnetic assembly distal face facing away from said frame surface;
   flux concentrator means disposed adjacent to said principal magnetic assembly distal face and recessed a sufficient distance from the edges of said principal magnetic assembly to inhibit the loss of magnetic flux, said flux concentrator means and said frame sandwiching said assembly therebetween, said flux concentrator means having a proximal face facing toward said magnetic assembly and a distal face facing away from said principal magnetic assembly; and
   pole means comprising a soft magnetic material disposed adjacent to said distal face of said flux concentrator means, said pole means defining a scanning area substantially smaller than the area of said distal face of said flux concentrator means such that said pole means exhibits parallel lines of magnetic flux for inducing polarization in living tissue the area between the edges of said recessed flux concentrator means and said edges of said assembly being filled with a nonmagnetic material.

2. The apparatus of claim 1, wherein said nonmagnetic material includes aluminum.

3. The apparatus of claim 1, additionally comprising permanent magnetic elements positioned adjacent to said non-magnetic material to inhibit the loss of magnetic flux.

4. An NMR scanner apparatus using a permanent magnetic field produced by low-energy magnetic elements, comprising:

a principal assembly of magnetic material formed of a substantial number of low-energy permanent magnetic elements producing magnetic flux and arranged in at least one row of columns;

a frame of magnetically soft material providing a return path for said magnetic flux, said frame having a surface, said columns of magnetic elements extending from said frame surface so that said columns of magnetic elements cooperatively define a principal magnetic assembly distal face facing away from said frame surface;

flux concentrator means disposed adjacent to said principal magnetic assembly distal face and recessed a sufficient distance from the edges of said principal magnetic assembly to inhibit the loss of magnetic flux, said flux concentrator means and said frame sandwiching said assembly therebetween, said flux concentrator means having a proximal face facing toward said principal magnetic assembly and a distal face facing away from said principal magnetic assembly; and pole means comprising a soft magnetic material disposed adjacent to said distal face of said flux concentrator means, said pole means defining a scanning area substantially smaller than the area of said distal face of said flux concentrator means such that said pole means exhibits parallel lines of magnetic flux for inducing polarization in living tissue, additionally comprising a reverse assembly of low energy permanent magnetic elements arranged in rows of columns and positioned on said distal face of said flux concentrator means around said pole means, said reverse assembly being of opposite polarity to said principal assembly such that said magnetic flux is concentrated in said flux concentrator means.

5. An NMR scanner including a field-producing apparatus comprising:

(a) a frame of magnetically soft material defining an opening, said frame including a first frame member on one side of said opening;

(b) a first magnet structure projecting from said first frame member into said opening in a first direction, said first structure including:

(1) a principal magnetic flux-producing body producing magnetic flux in a flux direction parallel to said first direction, said principal body having a distal face remote from said first frame member and facing away from said first frame member, said distal face extending in lateral directions transverse to said first direction;

(2) a magnetically conductive flux concentrator plate overlying said distal face of said principal body, the extent of said first flux concentrator plate in each of said lateral directions being less than the corresponding extent of said distal face of said principal body, whereby the edges of said flux concentrator plate are recessed in said lateral directions relative to the edges of said distal face of said principal body; and (3) a magnetically conductive pole piece juxtaposed with said flux concentrator plate and projecting in said first direction from said flux concentrator plate, the extent of said pole piece in each of said lateral directions being less than the corresponding extent of said flux concentrator plate, whereby said flux concentrator plate will concentrate said flux from said first principal body in said first pole piece said frame providing a return flux path for magnetic flux emanating from said first structure, said field-producing apparatus being adapted to receive a human body in said opening adjacent said pole piece and to provide a magnetic field within a scanning volume adjacent said pole piece for NMR imaging of a human body disposed within said opening.

6. An NMR scanner as claimed in claim 5 wherein said flux concentrator plate has a proximal face facing towards said principal body and a distal face facing away from said principal body, said pole piece projecting from said distal face of said flux concentrator plate, said distal face of said flux concentrator plate being substantially planar and extending substantially perpendicular to said first direction.

7. An NMR scanner as claimed in claim 6 wherein said flux concentrator plate has edge surfaces extending between its proximal and distal faces, said edge surfaces extending substantially perpendicular to said distal face of said flux concentrator plate.

8. An NMR scanner as claimed in claim 5 wherein said flux concentrator plate has a proximal face facing towards said distal face of said principal body, a distal face facing away from said distal face of said principal body, and edge faces extending between the proximal and distal faces of said flux concentrator plate, and wherein said first structure further comprises a peripheral magnetic flux-producing body aligned with said edge faces of said flux concentrator plate, said peripheral magnetic flux-producing body producing magnetic flux in directions transverse to said first direction so that the flux produced by said peripheral magnetic flux-producing body will oppose leakage of magnetic flux from said edge faces of said flux concentrator plate.

9. An NMR scanner as claimed in claim 8 wherein said peripheral magnetic flux-producing body extends around the entire periphery of said flux concentrator plate so that flux produced by said peripheral magnetic flux concentrator plate will oppose flux leakage from all of said edge faces of said flux concentrator plate.

10. An NMR scanner as claimed in claim 9 wherein said first structure includes a reverse magnetic field-producing body extending around said pole piece and overlying said distal surface of said flux concentrator plate, said reverse magnetic field-producing body producing magnetic flux in a reverse direction opposite to the flux direction of said principal magnetic flux-producing body, whereby said reverse magnetic field-producing element will oppose leakage of flux through said distal face of said flux concentrator plate.

11. An NMR scanner as claimed in claim 10 wherein said reverse body extends, in each lateral direction transverse to said first direction, beyond the edges of said flux concentrator plate, whereby said distal face of said principal body, said reverse body, and said peripheral body cooperatively define a space extending around said flux concentrator plate.

12. An NMR scanner as claimed in claim 11 wherein said distal surface of said flux concentrator plate is substantially planar, said pole piece is substantially cylindrical and the axis of said cylindrical pole piece extends substantially in said first direction and substantially perpendicular to said planar distal surface of said flux concentrator plate.

13. An NMR scanner as claimed in any one of claims 5, 11, or 12 wherein said frame includes a second frame member on the side of said opening opposite to said first frame member, said magnetic field-producing apparatus further comprising a second magnet structure projecting from said second frame member into said opening in the direction opposite to said first direction, said second magnet structure including a principal magnetic flux-producing body, flux concentrator plate, and pole piece substantially identical to the corresponding cmponents of said first permanent magnet structure, said principal body of said second magnet structure producing flux in the same flux direction as the principal body of said first magnet structure, whereby the fluxes produced by said principal bodies will reinforce one another, said pole pieces of said magnetic structures facing toward one another and defining therebetween said scanning volume, whereby flux produced by both of said principal bodies will pass between said principal bodies on a common flux path including said flux concentrator plates, said pole pieces, and said scanning volume.

14. An NMR scanner as claimed in claim 13 wherein said pole pieces and said flux concentrator plates consist essentially of soft magnetic material.

15. An NMR scanner as claimed in claim 14 wherein said magnetic flux-producing bodies consist essentially of low-energy magnetic field-producing materials.

16. An NMR scanner as claimed in claim 15 wherein all of said magnetic flux-producing bodies consist essentially of ceramic magnetic elements.

17. An NMR scanner as claimed in claim 15 wherein each of said magnetic flux-producing bodies includes an assembly of magnetic material formed of a plurality of low-energy, permanent magnetic elements.

18. An NMR scanner including a field-producing apparatus comprising:
  (a) a frame of magnetically soft material defining an opening, said frame including a first frame member on one side of said opening;
  (b) a first magnet structure, said first magnet structure projecting from said first frame member into said opening in a first direction, said first magnet structure including:
    (1) a principal magnetic flux-producing body producing magnetic flux in a flux direction parallel to said first direction, said principal body having a distal face remote from said first frame member and facing away from said frame member, said distal face extending in lateral directions transverse to said first direction;
    (2) a magnetically conductive flux concentrator plate overlying said distal face of said principal body, said flux concentrator plate having a distal face facing away from said principal body; and
    (3) a magnetically conductive, substantially cylindrical pole piece juxtaposed with said flux concentrator plate and projecting in said first direction from said distal face of said flux concentrator plate, the axis of said pole piece extending in said first direction, the diameter of said pole piece being less than the extent of said flux concentrator plate in each of said lateral directions, whereby said flux concentrator plate will concentrate said flux from said first principal body in said first pole piece;

said frame providing a return flux path for magnetic flux emanating from said first structure, said field-producing apparatus being adapted to receive a human body in said opening adjacent said pole piece and to provide a magnetic field within a scanning volume adjacent said pole piece for NMR imaging of a human body disposed within said opening.

19. An NMR scanner as claimed in claim 18 wherein said distal face of said flux concentrator plate is substantially planar and extends substantially perpendicular to said first direction.

20. An NMR scanner as claimed in claim 19 wherein said flux concentrator plate has a proximal face facing towards said distal face of said principal body, and edge faces extending between the proximal and distal faces of said flux concentrator plate, and wherein said first structure further comprises a peripheral magnetic flux-producing body aligned with said edge faces of said flux concentrator plate, said peripheral magnetic flux-producing body producing magnetic flux in directions transverse to said first direction so that the flux produced by said peripheral magnetic flux-producing body will oppose leakage of magnetic flux from said edge faces of said flux concentrator plate.

21. An NMR scanner as claimed in claim 20 wherein said first structure includes a reverse magnetic flux-producing body extending around said pole piece and overlying said distal surface of said flux concentrator plate, said reverse magnetic flux-producing body producing magnetic flux in a reverse direction opposite to the flux direction of said principal magnetic flux-producing body, whereby said reverse magnetic flux-producing element will oppose leakage of flux through said distal face of said flux concentrator plate.

22. An NMR scanner as claimed in claim 18 wherein said frame includes a second frame member on the side of said opening opposite to said first frame member, said magnetic field producing apparatus further comprising a second magnet structure projecting from said second frame member into said opening in the direction opposite to said first direction, said second magnet structure including a principal magnetic field-producing body, flux concentrator plate, and pole piece substantially identical to the corresponding components of said first magnet structure, said principal body of said second magnet structure producing flux in the same flux direction as the principal body of said first magnet structure, whereby the fluxes produced by said principal bodies will reinforce one another, said pole pieces of said magnet structures facing toward one another and defining therebetween said scanning volume, whereby flux produced by both of said principal bodies will pass between said principal bodies on a common flux path including said flux concentrator plates, said pole pieces, and said scanning volume.

* * * * *